US012723309B2

(12) United States Patent
Miccoli et al.

(10) Patent No.: US 12,723,309 B2
(45) Date of Patent: Sep. 1, 2026

(54) METHOD AND DEVICE FOR DEPOSITING A LAYER CONTAINING A GROUP FIVE ELEMENT IN A PROCESS CHAMBER AND SUBSEQUENT CLEANING OF THE PROCESS CHAMBER

(71) Applicant: AIXTRON SE, Herzogenrath (DE)

(72) Inventors: Ilio Miccoli, Herzogenrath (DE); Hassan Larhrib, Herzogenrath (DE); Peer Mukinovic, Baesweiler (DE)

(73) Assignee: AIXTRON SE, Herzogenrath (DE)

( * ) Notice: Subject to any disclaimer, the term of this patent is extended or adjusted under 35 U.S.C. 154(b) by 40 days.

(21) Appl. No.: 18/714,503

(22) PCT Filed: Dec. 1, 2022

(86) PCT No.: PCT/EP2022/084088

§ 371 (c)(1),
(2) Date: May 29, 2024

(87) PCT Pub. No.: WO2023/099674

PCT Pub. Date: Jun. 8, 2023

(65) Prior Publication Data

US 2025/0019823 A1 Jan. 16, 2025

(30) Foreign Application Priority Data

Dec. 3, 2021 (DE) ..................... 10 2021 131 983.8
Jun. 10, 2022 (DE) ..................... 10 2022 114 717.7

(51) Int. Cl.
*C23C 16/44* (2006.01)
*C23C 16/30* (2006.01)
(Continued)

(52) U.S. Cl.
CPC ........ *C23C 16/4405* (2013.01); *C23C 16/301* (2013.01); *C23C 16/4584* (2013.01); *C23C 16/4586* (2013.01); *C23C 16/52* (2013.01)

(58) Field of Classification Search
CPC .............. C23C 16/4405; C23C 16/301; C23C 16/4584; C23C 16/4586; C23C 16/52
See application file for complete search history.

(56) References Cited

U.S. PATENT DOCUMENTS 4,816,113 A * 3/1989 Yamazaki ................ C23G 5/00
427/571
6,042,654 A * 3/2000 Comita ............... C23C 16/4405
134/21
(Continued)

FOREIGN PATENT DOCUMENTS

DE 10 2012 101 438 A1 8/2013
DE 10 2013 104 105 A1 10/2014
DE 10 2017 100 725 A1 3/2018

OTHER PUBLICATIONS

Written Opinion mailed Mar. 21, 2023, from the ISA/European Patent Office, for International Patent Application No. PCT/EP2022/084088 (filed Dec. 1, 2022), English translation, 7 pgs.
(Continued)

*Primary Examiner* — Kelly M Gambetta
(74) *Attorney, Agent, or Firm* — Ascenda Law Group, PC

(57) ABSTRACT

A method for depositing layers containing a group five element on a substrate, in which process gas is fed into a process chamber. After depositing the layer, the process chamber is cleaned as follows. The process chamber is heated to a first cleaning temperature. After reaching the first cleaning temperature, a halogen or a halogen compound is fed into the process chamber in a first cleaning step. After the first cleaning step, the process chamber is brought to a second cleaning temperature. After reaching the second
(Continued)

cleaning temperature, $O_2$ is fed into the process chamber in a second cleaning step. After the second cleaning step, the process chamber is brought to a third cleaning temperature. After reaching the third cleaning temperature, substantially only $H_2$ is fed into the process chamber in a third cleaning step. After the third cleaning step, the process chamber is cooled.

11 Claims, 3 Drawing Sheets

(51) Int. Cl.
*C23C 16/458* (2006.01)
*C23C 16/52* (2006.01)

(56) References Cited

U.S. PATENT DOCUMENTS

2010/0273290 A1 10/2010 Kryliouk
2013/0005118 A1 1/2013 Jun et al.
2016/0076145 A1* 3/2016 Eickelkamp .......... C23C 16/303 427/255.394
2020/0157677 A1* 5/2020 Harashima .......... C23C 16/4583
2020/0385861 A1 12/2020 Deye et al.

OTHER PUBLICATIONS

International Preliminary Report on Patentability issued May 2, 2024, from The International Bureau of WIPO, for International Patent Application No. PCT/EP2022/084088 (filed Dec. 1, 2022), 15 pgs.
International Search Report mailed Mar. 21, 2023, from the ISA/European Patent Office, for International Patent Application No. PCT/EP2022/084088 (filed Dec. 1, 2022), 5 pgs.
Written Opinion mailed Mar. 21, 2023, from the ISA/European Patent Office, for International Patent Application No. PCT/EP2022/084088 (filed Dec. 1, 2022), 6 pgs.

* cited by examiner 25
26
27
28
29
27
26
25
AsH3
PH3
TMGa
TMIn
H2
N2
Cl2+N2
O2+N2
30
32
14
16
12
1
6
17
15
13
11
10
2
II
II
19
7
5
4
3
18
5
4
31
9
8

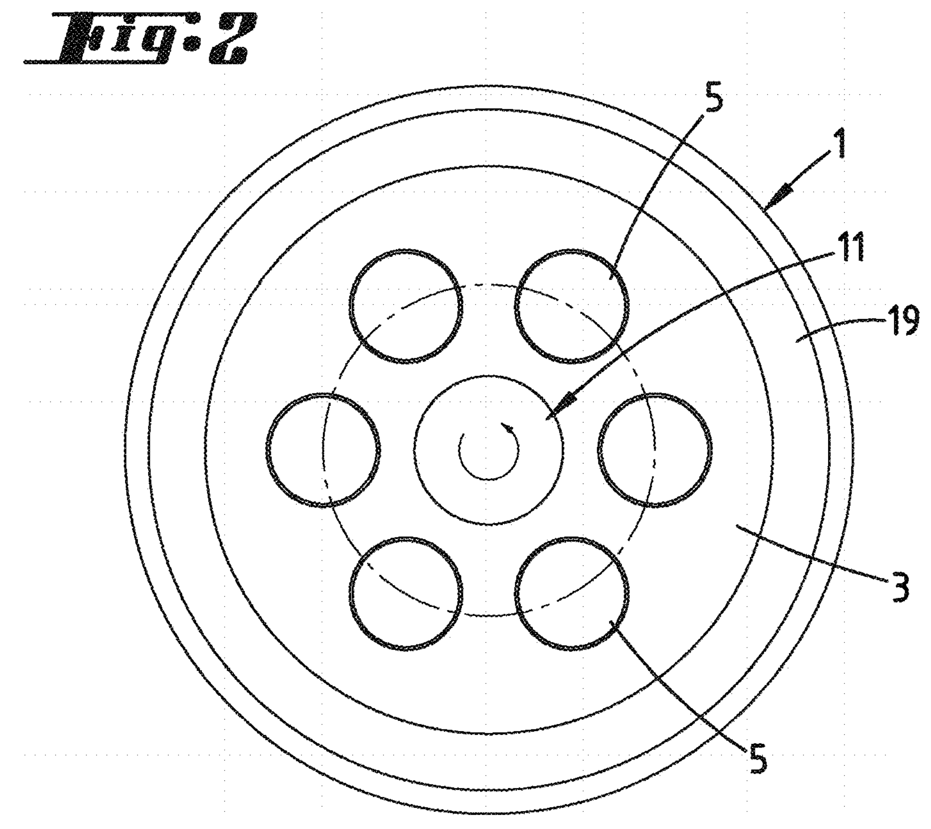
Fig:2
5
1
11
19
3
5
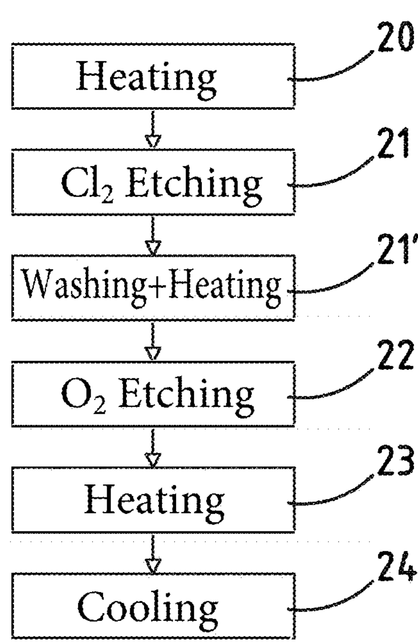
Fig:3
Heating
20
Cl2 Etching
21
Washing+Heating
21'
O2 Etching
22
Heating
23
Cooling
24

METHOD AND DEVICE FOR DEPOSITING A LAYER CONTAINING A GROUP FIVE ELEMENT IN A PROCESS CHAMBER AND SUBSEQUENT CLEANING OF THE PROCESS CHAMBER

RELATED APPLICATIONS

This application is a National Stage under 35 USC 371 of and claims priority to International Application No. PCT/EP2022/084088, filed 1 Dec. 2022, which claims the priority benefit of DE Application No. 10 2022 114 717.7, filed 10 Jun. 2022 and DE Application No. 10 2021 131 983.8, filed 3 Dec. 2021.

FIELD OF THE INVENTION

The invention relates to a method for the deposition of a layer containing an element of the $V^{th}$ main group on a substrate in a chemical vapor deposition (CVD) reactor. The CVD reactor has a reactor housing, in which a graphite part is arranged. The graphite part can be coated with SiC. It can be coated so as to be resistant to $Cl_2$. The graphite part is arranged in the process chamber such that it is coated with parasitic coatings consisting of decomposition products of the process gas when a coating process is executed. The method further relates to a cleaning process following the process step of the deposition of the coating on the substrate, which consists of a plurality of cleaning steps, which are executed successively in order to remove the parasitic coatings from the at least one graphite part.

The device in accordance with the invention has a control device, which contains a control program, which executes control commands with which valves and mass flow controllers of a gas supply device are switched and/or controlled, so that the method is executed in the device.

BACKGROUND

US 2020/385861 A1 describes a method, which is executed after the deposition of a coating in a CVD reactor, and in which $Cl_2$ is used to remove parasitic coatings from walls of components within the process chamber.

DE 10 2017 100 725 A1 describes a CVD reactor, and a method that is executed in the latter to remove coatings from the walls with the injection of chlorine.

In a method in accordance with the invention, a carbon-containing gas can also be a component of the process gas. For example, the process gas can contain an organometallic compound of an element of the $III^{rd}$ main group. This is particularly the case if a $III^{rd}$-$V^{th}$ layer—is deposited on the substrate. During the decomposition of this component of the process gas, carbon can be formed, which is deposited on a surface of the graphite part in the form of pure carbon, or as a component of a carbon compound. Carbon residues can form in particular if the process gas contains $NH_3$. DE 10 2013 104 105 A1 describes a method, in which such carbon residues can be removed using an etching gas.

U.S. Pat. No. 4,816,113 describes a method in which carbon residues are removed from a process chamber using a plasma and chlorine.

A cleaning process, in which chlorine is used, is also shown in US 2013/005118 A1.

SUMMARY OF THE INVENTION

The invention is based on the object of improving the cleaning steps in a generic method in a manner that is advantageous in use. In particular, the invention is also based on the task of improving a method for the deposition of a layer in a manner that is advantageous in use. The invention is also based on the object of making the cleaning steps more efficient. The invention is also based on the object of improving a method for the deposition of a layer comprising an element of the $II^{nd}$ to $VI^{th}$ main groups, which is followed by a cleaning process for the process chamber comprising a plurality of steps, and in particular for improving the cleaning process in a deposition process in which the process gas and/or the cleaning gas is fed into the center of a process chamber, flows through the process chamber in the radial direction, wherein a susceptor carrying rotating substrate holders is rotated about the center of the process chamber.

However, the method can also be executed in a device in which a gas inlet element is designed as a showerhead.

The object is achieved by the invention specified in the claims, wherein the subsidiary claims not only represent advantageous developments of the main claim, but also independent solutions to the object.

The inventive method presupposes the use of a CVD reactor which has a reactor housing in which there is located a further surface, which can be the surface of a graphite part, which is located in the reactor housing. There can also be a plurality of graphite parts in the reactor housing. At least one of the preferable plurality of graphite parts is preferably coated. It can be coated with silicon carbide. However, it can also be coated with another coating, which makes the graphite part resistant to an exposure to $Cl_2$, $O_2$, or HCl. The graphite parts can be parts of the process chamber, or parts that bound the process chamber. It is particularly envisaged that a susceptor, which forms the floor of the process chamber, consists of graphite and is coated with silicon carbide. The susceptor can have a rear face, which faces away from the process chamber and is adjacent to a heating zone. A heating device can be arranged in the heating zone. The heating device can be an infrared (IR) heater or a radio frequency (RF) heater. However, the graphite part can also be a process chamber ceiling, which bounds the process chamber at the top. The process chamber can be brought to an elevated temperature as a result of thermal radiation emitted by the susceptor. The susceptor can be heated to temperatures of up to 1,000° C. or more during the deposition of the layer. A gas inlet element can be arranged in the center of the process chamber. This can basically be made of quartz or a metal. However, it is also possible to manufacture the gas inlet element, or parts of the gas inlet element, from graphite. These parts can also be coated with silicon carbide. Pockets can be arranged in the susceptor. The pockets can be arranged in a uniform angular distribution around the center of the process chamber. They are thus located at an equal distance from the gas inlet element, so that process gas emerging from the gas inlet element flows in a radial direction through the process chamber and over the pockets. In each pocket there is at least one substrate holder, which supports the substrate so that the process gas flows over the substrate. Gas supply lines can open into the floors of the pockets, through which an inert gas can be fed into the pockets. A gas cushion is formed. A directed gas flow can by way of the gas cushion be used to force the substrate holder to rotate about its axis. The process chamber is surrounded by a gas outlet element, which can be made of a ceramic material or a metal. However, it is also possible to manufacture parts of the gas outlet element, or the entire gas outlet element, from graphite, and in particular from SiC-coated graphite. The gas inlet element can have a large number of gas outlet zones arranged one above the other, through which different components of the process gas can be fed into the process chamber. The graphite part can also be only partially coated with SiC.

However, a showerhead can also be used as a gas inlet element, in particular a plate with nozzles, which is arranged above the substrates so that the gas flows vertically into the process chamber in the direction of the substrates. However, the process gas can then also be removed from the process chamber in a radial direction. The process chamber can also be flowed through in a horizontal direction, wherein the flow can be from a center in a radial direction towards the outside, or also in a linear direction from one side of the process chamber to another side of the process chamber. The process chamber can therefore also be the chamber of a horizontal reactor, through which the flow is directed in a straight line in a horizontal direction.

This is preferably achieved by feeding a process gas containing one or more reactive gases into the process chamber. One of the plurality of reactive gases can consist of molecules containing an element of the $II^{nd}$-$VI^{th}$ main group, an element of the $III^{rd}$-$V^{th}$ main group, and in particular an element of the $V^{th}$ main group. The process gas preferably contains a plurality of reactive gases, for example a gas of the $III^{rd}$ and a gas of the $V^{th}$ main group or a gas of the $II^{nd}$ and the $VI^{th}$ main group, or one or a plurality of gases of the $IV^{th}$ main group. The process gas can thus be a mixture of a hydride of an element of the $V^{th}$ main group and an organometallic compound of an element of the $III^{rd}$ main group. The process gas can, for example, contain $AsH_3$, $PH_3$ (or also $NH_3$). The process gas can also contain an organometallic gas, which in particular contains an element of the $III^{rd}$ main group, for example TMGa, TMIn, or TMAl, or TEGa. The latter reactive gases are fed into the process chamber together with an inert gas, for example $H_2$. It is also possible to use a silicon-containing gas, for example a silane, and a carbon-containing gas, for example methane. In other forms of embodiment, the process gas can also contain an alkaline earth compound, such as a magnesium or a calcium compound. The process gas can also contain elements of the $VI^{th}$ main group, for example oxides. The reactive gases of the process gas decompose due to the increased temperature within the process chamber, and in particular due to the increased temperature of the substrate, so that a layer consisting of the elements of the $II^{nd}$-$VI^{th}$ main group and in particular the elements of the $III^{rd}$ and $V^{th}$ main groups is deposited on the substrate surface. At the same time, the reaction products of the reactive gases, or parasitic compounds of the reaction products of the reactive gases that form, condense on the surfaces of the process chamber, and in particular on the surfaces of the at least partially coated graphite parts, in particular those coated with a $Cl_2/O_2$-resistant coating, such as SiC. After completion of the first step, for example after the deposition of one or a plurality of layers on the substrate, the at least one substrate is removed from the process chamber. In this intermediate step of the removal of the substrates from the process chamber, no reactive gases, or at most the reactive gas of the $V^{th}$ main group, are fed into the process chamber. Otherwise, only an inert gas, for example hydrogen, is fed into the process chamber. During the intermediate step of the removal of the at least one substrate, the process chamber can be cooled down to a lower temperature.

In a further process following the first step, the process chamber is cleaned. The parasitic coatings on the walls of the process chamber, and in particular on the walls of the graphite parts, are removed. This is achieved by the injection of cleaning gases, which successively form various volatile compounds with the molecules of the coating, which compounds are then transported away through the gas outlet element. In accordance with the invention, it is envisaged that after removal of the at least one substrate, the process chamber is heated to a first cleaning temperature. The first cleaning temperature can be in a range from 500° C. to 1,000° C., or in a range between 800° C. and 900° C. At the first cleaning temperature, a first cleaning step is executed, in which a halogen or a halogen compound, is fed into the process chamber.

In one embodiment of the invention, HCl or $Cl_2$ is preferably fed into the process chamber. The halogen, or $Cl_2$, is fed into the process chamber together with nitrogen. The total pressure in the process chamber can lie in the range between 50 mbar and 200 mbar. It is also envisaged that approximately 10 slm $N_2$ is fed into the process chamber during the first cleaning step.

However, it is also possible to feed in other flows of this inert gas, for example nitrogen, at a flow of 110 slm. The first cleaning gas used for cleaning, and other cleaning gases referred to below, are each provided in the form of gas sources. The halogen, for example $Cl_2$, can be provided in any desired mixing ratio with nitrogen. A 5% mixture is preferred. This cleaning gas is fed into the process chamber at a mass flow rate of 2 to 40 slm, when the temperature of the process chamber has reached the first cleaning temperature. In the first cleaning step, essentially metallic components of the parasitic coating and components belonging to the $V^{th}$ main group are converted into volatile compounds, which are then removed from the process chamber together with the inert gas. Etching rates of 80±20 μm/h are achieved, particularly with $Cl_2$.

The intermediate step of heating the process chamber from, for example, 300° C. to a first cleaning temperature of, for example, 900° C., takes about 10 minutes. During this intermediate step, the inert gas can be switched from hydrogen to nitrogen. During the intermediate step, the total pressure inside the process chamber can also be altered to the above-cited pressure, and in particular, can be lowered.

The first cleaning step is executed at a constant temperature of, for example, 900° C. for about 20-30 minutes. The supply of the first cleaning gas is then switched off. In a subsequent intermediate step, the temperature of the process chamber is altered, and, in particular, increased to a second cleaning temperature. During this intermediate step, the total pressure inside the process chamber can also be altered.

The intermediate step is terminated when the second cleaning temperature is reached. The second cleaning temperature can lie between 500° C. and 1,100° C. It can, for example, lie between 950° C. and 1,000° C. As soon as the second cleaning temperature is reached, a second cleaning gas is fed into the process chamber. This cleaning gas can take the form of “Dry Air”, $O_3$, $O_2$, or also $NH_3$. The cleaning gas can be provided as a mixture in nitrogen. Preferably, 9 slm of this mixture is fed into the process chamber. Together with this second cleaning gas, $N_2$ is fed into the process chamber, preferably with a mass flow of 11 slm. The total pressure during the second cleaning step is between 100 mbar and 800 mbar, in particular between 600 mbar and 800 mbar. During the second cleaning step, carbon-containing components of the parasitic coating are essentially removed. To this end, the carbon reacts, or the carbon-containing compounds react, with the oxygen fed in to form oxides of carbon. The second cleaning step can be executed for a duration of 7-15 minutes. It is preferable that the duration of the second cleaning step is shorter than the duration of the first cleaning step. However, the duration may also depend on the layer thickness to be removed. The removal of a thicker layer requires a longer time than the removal of a thinner layer.

In a further intermediate step after the second cleaning step, in which no cleaning gas but only an inert gas is fed into the process chamber, the temperature of the process chamber is altered, and in particular, is lowered to a third cleaning temperature, which can lie between 500° C. and 1,100° C. However, it can also lie between 800° C. and 1,000° C. At the same time, the total pressure in the process chamber can also be altered. The total pressure is preferably lowered to a pressure between 50 mbar and 200 mbar. A third cleaning step is then executed at this total pressure. During the intermediate step, the inert gas can also be altered so that hydrogen is fed into the process chamber after the intermediate step.

The third cleaning step is an "$H_2$-bake" or an "$N_2$-bake", in which the process chamber is essentially only heated in the presence of $H_2$. This takes place at the above-cited third cleaning temperature for a period of between 15 minutes and 30 minutes. The third cleaning step can be longer than the first cleaning step. During the third cleaning step, only hydrogen is fed into the process chamber, preferably at a mass flow rate of 26 slm.

The third cleaning step can be followed by further optional steps, in which the process chamber is alternately flooded with an inert gas, which can be hydrogen or nitrogen, and evacuated. This is achieved with a vacuum pump that is connected to the gas outlet element.

BRIEF DESCRIPTION OF THE DRAWINGS

In what follows, an example embodiment of the invention is explained with reference to the accompanying drawings. Here:

FIG. 2 shows a cross-section along the line II-II in FIG. 1;

FIG. 3 shows a flow chart of the cleaning steps that follow a process step in which a layer is deposited on a substrate.

DETAILED DESCRIPTION

Figure 1:
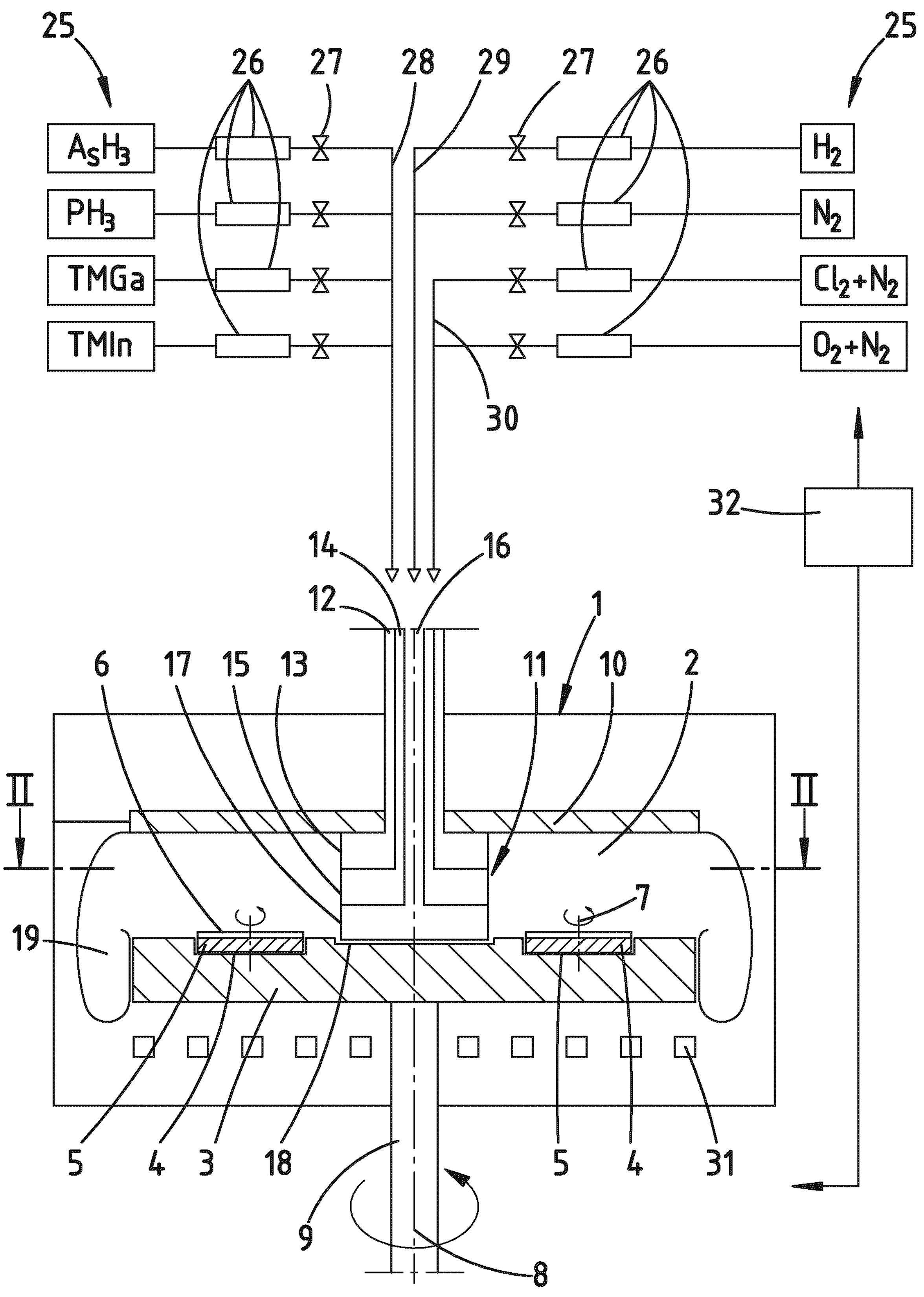
FIG. 1 shows a schematic cross-section of a CVD reactor, a gas supply device with gas sources 25, and a schematic of an electronic control device.

The inventive method is executed in a device as shown in FIG. 1. A CVD reactor has a gas-tight housing 1, made, for example, from stainless steel, in which a process chamber 2 is located. The floor of the process chamber 2 is formed by a susceptor 3, which can be made of graphite, and which is coated with SiC. The susceptor 3 has the shape of a circular disk, and a downward-facing rear face that faces towards a heating device 31. The heating device 31 can take the form of a coil, which generates an RF field that induces eddy currents in the susceptor 3, which heat the susceptor 3 up to a process temperature.

The susceptor 3 can be rotated about an axis of rotation 8 using a shaft 9 and a rotary drive (not shown). Also not shown are supply lines that run through the shaft 9 in order to feed an inert gas into the gas channels (not shown) of the susceptor 3. These gas channels open into the floors of pockets 4, which are arranged in the upward-facing surface of the susceptor 3. A substrate holder 5 made of graphite is inserted into each of these pockets 3. The substrate holder 5 can also be coated with SiC. A substrate 6 can be placed on the substrate holder 5. This can be a substrate made of Si, GaAs, or a substrate made of sapphire or another suitable material.

In the central region of the susceptor 3, there is a recess 18, into which a lower section of a gas inlet element 11 can be inserted. The gas inlet element 11 is fixedly attached to the housing 1, and has three gas outlet zones 13, 15, 17, arranged vertically one above the other. A gas supply line 12, 14, 16 leads to each of the three gas outlet zones 13, 15, 17. Reactive gases and inert gases can be fed through the gas supply lines 12, 14, 16 into the process chamber 2, which extends between a process chamber ceiling 10 and the susceptor 3. The process gas, which enters the process chamber 2 through the gas outlet zones 13, 15, 17, flows through the process chamber 2 in a radial direction and thereby flows over the substrates 6.

FIG. 1 just shows one example of a process chamber in a CVD reactor. In further examples of embodiment (not shown), the central gas inlet element 11 can have another configuration. Furthermore, example embodiments are envisaged in which the gas inlet element is formed by a ceiling of the process chamber, and has a large number of essentially evenly distributed gas outlet openings in the form of a showerhead.

The process chamber ceiling 2 can be made of graphite and coated with SiC.

The process chamber 2 is surrounded by an annular gas outlet element 19, which has a gas outlet opening (not shown), to which a suction line of a vacuum pump (not shown) is connected, so as to evacuate the process chamber 2, or so as to be able to set a predetermined total pressure in the process chamber 2.

FIG. 1 also shows schematically a gas supply device with a large number of gas sources 25. The gas supply device can, for example, provide the following gases: $AsH_3$, $PH_3$ as a component of a reactive gas of a process gas, TMGa, TMIn also as a component of the reactive gas of the process gas for the deposition of a $III^{rd}$-$V^{th}$ layer on the substrates 6 arranged in an annulus around the gas inlet element 11 in accordance with FIG. 2. The gas supply device can also provide inert gases, for example $H_2$ and $N_2$. Furthermore, the gas supply device can provide cleaning gases $Cl_2$ and $O_2$. The two cleaning gases are preferably provided as a 5% mixture in $N_2$.

A programmable electronic control device 32 can control valves 27 and mass flow controllers 26 to feed predetermined mass flows of the above-cited gases through the supply lines 12, 14, 16, 28, 29, 30 into the process chamber 2.

One of the devices described above is used to deposit layers of elements from the $III^{rd}$ and $V^{th}$ main groups on the substrates 6 described above. These can take the form of GaInAsP layers, or layers containing at least two of the above-cited elements. To this end, the substrates are first brought into the process chamber 2 and then, after the process chamber 2 has been heated to a process temperature, the above-described reactive gases are fed into the process chamber 2. After the one or plurality of layers have been deposited, the process chamber 2 is cooled to, for example, 200-300° C., 300-400° C., or 300° C., and the substrates are removed. During the above-described deposition process, coatings form on some SiC surfaces from the solid chemical compounds that are formed during the reactions of the reactive gases.

Figure 4:
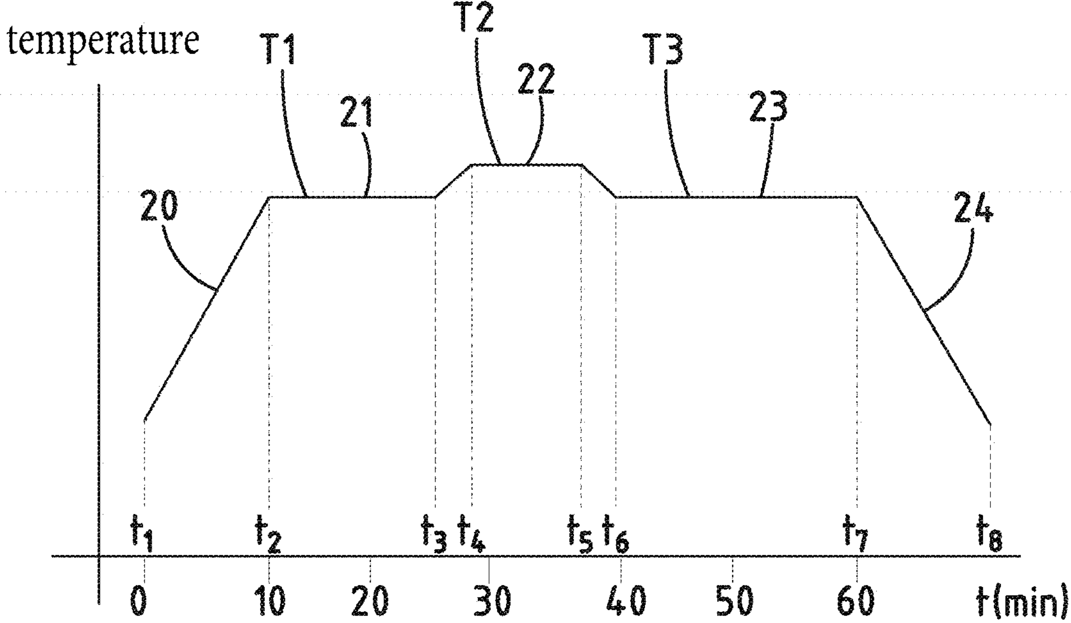
FIG. 4 shows a time-temperature diagram of the cleaning process illustrated in FIG. 3.

Referring to FIG. 4, after the substrates have been removed, the temperature inside the process chamber 2 is heated in a heating step 20 from a time $t_1$ to a time $t_2$ to a first cleaning temperature $T_1$, which can be between 800° C. and 1,000° C., and which can be 900° C. A total pressure of between 50 mbar and 100 mbar is set in the process chamber.

After achievement of the first cleaning temperature $T_1$, $Cl_2$ is fed into the process chamber, together with $N_2$, in a first cleaning step 21 from time $t_2$ to time $t_3$. In the process chamber 2, a reaction of the chemical compounds deposited on the SiC surfaces with $O_2$ takes place. Volatile reaction products are formed, which are removed from the process chamber 2 with the $N_2$.

In an intermediate step following the first cleaning step 21, the temperature of the process chamber 2 is heated from a time $t_3$ to a time $t_4$ in an $N_2$ atmosphere to a second cleaning temperature $T_2$, which can be between 900° C. and 1,000° C., or between 1,000° C. and 1,100° C., but which can also be between 1,100° C. and 1,200° C., or which can be 1,050° C. The total pressure inside the process chamber is altered. In particular, it is altered to a pressure between 600 mbar and 800 mbar. After achievement of the second cleaning temperature $T_2$, $O_2$ is fed into the process chamber together with $N_2$ during the time from $t_4$ to $t_5$. During this second cleaning step 22, carbon compounds are removed from the SiC surfaces by means of a chemical reaction of the carbon compounds with oxygen. Volatile oxides are formed, which are removed from the process chamber 2 together with the $N_2$.

After the time $t_5$ has been reached, the temperature of the process chamber is altered to a third cleaning temperature $T_3$. In particular, the temperature is lowered to a temperature that can be between 800° C. and 1,000° C., or to a temperature that can be 900° C. At the same time, the total pressure can be set to a value between 50 mbar and 100 mbar. After achievement of the third cleaning temperature $T_3$, only $H_2$ is fed into the process chamber during the time from $t_6$ to $t_7$. During this third cleaning step 23, any remaining oxides are removed from the surfaces. A conditioning of the CVD reactor can also be executed.

When the time $t_7$ has been reached, the temperature of the process chamber 2 is lowered, for example, to between 200° C. and 400° C., or to 300° C., in a cooling phase 24. At the time $t_7$, when the process temperature 2 has reached the value of 300° C., for example, approximately 70 minutes have passed since the start of the cleaning process at the time $t_1$.

FIG. 3 shows an example of embodiment in which a heating step 20 is followed by a $Cl_2$ etching step 21, and a rinsing step 21' is executed before a subsequent $O_2$ etching step 22. The $O_2$ etching step 22 is followed by a heating step 23, which in turn is followed by a cooling step 24.

During the rinsing step 21', the etching gases used in the $Cl_2$ etching step 21, and in particular $Cl_2$, can be completely removed from the reactor housing so that no more $Cl_2$ is present in the process chamber in a subsequent $O_2$ etching step 22.

An example of embodiment of the method can be executed with the following steps:

Heating of the process chamber to a first cleaning temperature $T_2$ (800° C. to 900° C.), Injection of $Cl_2$ into a nitrogen atmosphere (5% $Cl_2$ 12 slm, $N_2$ 11 slm, total pressure 50 mbar to 100 mbar), Termination of the injection of $Cl_2$ and heating up to a second cleaning temperature $T_2$ (950° C. to 1,000° C.), Injection of $O_2$ into a nitrogen atmosphere (5% $O_2$ 9 slm, $N_2$ 11 slm, total pressure 600 mbar to 800 mbar)

Termination of the injection of $O_2$ and alteration of the temperature to a third cleaning temperature $T_3$ (800° C. to 1,000° C.), Baking in a hydrogen atmosphere (26 slm, total pressure 50 mbar to 100 mbar)

The above statements serve to explain the inventions covered by the application as a whole; these also further develop the prior art, at least by means of the following combinations of features and also independently, wherein two, a plurality of, or all of, these combinations of features can also be combined, namely:

A method for the deposition of a layer containing an element of the $V^{th}$ main group on a substrate (6) in a CVD reactor, wherein the CVD reactor has a reactor housing (1), in which is arranged at least one graphite part (3, 5, 10, 11, 19) coated with SiC, which, during deposition, comes into contact with process gas fed into a process chamber (2) of the CVD reactor, such that a decomposition product of the process gas is deposited on the surface of the graphite part (3, 5, 10, 11, 19), forming a parasitic coating, wherein a process gas is provided, which has molecules containing an element of the $V^{th}$ main group; wherein at least one substrate (6) is brought into the process chamber (2); wherein the process gas is fed into the process chamber (2), the process gas decomposes in the process chamber (2) heated to a process temperature, and the $V^{th}$ main group element is deposited on the substrate (6) as a component of the layer on the substrate; wherein the substrate (6) is removed from the process chamber (2); wherein the process chamber (2) is heated to a first cleaning temperature ($T_1$); wherein after achievement of the first cleaning temperature ($T_1$), a halogen or a halogen compound, is fed into the process chamber (2) in a first cleaning step (21); wherein after the first cleaning step (21), the process chamber (2) is brought to a second cleaning temperature ($T_2$); wherein after achievement of the second cleaning temperature ($T_2$), $O_2$ is fed into the process chamber (2) in a second cleaning step (22); wherein after the second cleaning step (22), the process chamber (2) is brought to a third cleaning temperature ($T_3$); wherein after achievement of the third cleaning temperature ($T_3$) in a third cleaning step (23) essentially only $H_2$ is fed into the process chamber (2); and wherein after the third cleaning step (23), the process chamber (2) is cooled (24).

A method, which is characterized in that the process gas contains $AsH_3$, $PH_3$, or $NH_3$, and/or in that the process gas additionally contains a gas, the molecules of which contain an element of the $III^{rd}$ main group, and/or in that the process gas additionally contains TMGa, TMIn, or TMAl.

A method, which is characterized in that during heating (20) an inert gas, and/or a noble gas, and/or $N_2$ or $H_2$, is fed into the process chamber (2), and/or only an inert gas is fed into the process chamber (2).

A method, which is characterized in that during the first cleaning step (21) only the halogen. or the halogen compound, and $N_2$ is fed into the process chamber (2), and/or only $Cl_2$ is fed into the process chamber (2), together with $N_2$.

A method, which is characterized in that during the second cleaning step (22) only $O_2$, together with $N_2$, is fed into the process chamber (2).

A method, which is characterized in that during the cooling process (24) only $H_2$ is fed into the process chamber (2).

A method, which is characterized in that the graphite part is a susceptor (3) bounding the process chamber (2), and/or in that the graphite part is a process chamber ceiling (10) bounding the process chamber (2), and/or in that the graphite part is a gas inlet element (11), and/or in that the graphite part is a gas outlet element (19), and/or in that the graphite part is a substrate holder (5), which is mounted in a pocket (4) of the susceptor (3), wherein an inert gas can be fed into the pocket (4) through a gas supply line such that a gas cushion is there formed, which causes the substrate holder (5) to rotate about an axis (7).

A method, which is characterized in that the susceptor (3) is driven in rotation about an axis of rotation (8), at least during the deposition of the layer, and/or in that the susceptor (3) is heated by a heating device (31) during the deposition of the layer and during the heating process (20), and/or during the three cleaning steps (21, 22, 23).

A device for the execution of the method with a CVD reactor, which has a reactor housing (1) in which at least one graphite part (3, 5, 10, 11, 19) is arranged, with a gas supply device that has gas sources (25) with which a process gas whose molecules have an element of the $III^{rd}$ main group, a halogen. or a halogen compound, $O_2$, $H_2$ and $N_2$ is provided, and with a control device (32) for the control of valves (27) and mass flow controllers (26), such that a process in accordance with one of the claims 1-8 is executed in a process chamber (2) of the reactor housing (1).

All disclosed features are essential to the invention (individually, but also in combination with each other). The disclosure of the application hereby also includes the full disclosure content of the associated/attached priority documents (copy of the previous application), also for the purpose of including features of these documents in the claims of the present application. The subsidiary claims, even without the features of a claim referred to, characterise with their features independent inventive developments of the prior art, in particular in order to make divisional applications on the basis of these claims. The invention specified in each claim can additionally have one or a plurality of the features specified in the above description, in particular those provided with reference numerals, and/or in the list of reference numerals. The invention also relates to forms of design, in which individual features cited in the above description are not realized, in particular to the extent that they can recognisably be dispensed with for the respective intended use, or can be replaced by other means having the same technical effect.

LIST OF REFERENCE SYMBOLS

1 Reactor housing
2 Process chamber
3 Susceptor
4 Pocket
5 Substrate holder
6 Substrate
7 Substrate holder axis of rotation
8 Susceptor axis of rotation
9 Shaft
10 Process chamber ceiling
11 Gas inlet element
12 Supply line
13 Gas outlet zone
14 Supply line
15 Gas outlet zone
16 Supply line
17 Gas outlet zone
18 Recess
19 Gas outlet element
20 Heating step
21 Cleaning with chlorine
21 Rinsing step
22 Cleaning with oxygen
23 Bake with hydrogen
24 Cooling step
25 Gas source
26 Mass flow controller
27 Valve
28 Supply line
29 Supply line
30 Supply line
31 Heating device
32 Control device

What is claimed is:

1. A method for depositing a layer on a substrate (6) in a process chamber (2) arranged in a reactor housing (1) of a chemical vapor deposition (CVD) reactor, the method comprising:

loading the substrate (6) into the process chamber (2);

heating the process chamber (2) to a process temperature;

feeding a process gas into the process chamber (2) comprising at least $A_SH_3$ or $PH_3$, wherein at the process temperature, the process gas decomposes into decomposition products, and wherein the decomposition products are deposited as a layer on a first surface on the substrate (6) and are deposited as a parasitic coating on a second surface in the reactor housing (1);

removing the substrate (6) from the process chamber (2);

heating the process chamber (2) to a first cleaning temperature ($T_1$) in a range between 800° C. and 900° C.;

after the process chamber (2) has reached the first cleaning temperature ($T_1$), feeding a $Cl_2$ into the process chamber (2) in a first cleaning step (21);

after the first cleaning step (21), bringing the process chamber (2) to a second cleaning temperature ($T_2$);

after the process chamber (2) has reached the second cleaning temperature ($T_2$) in a range between 500° C. and 1100° C., feeding $O_2$ into the process chamber (2) in a second cleaning step (22);

after the second cleaning step (22), bringing the process chamber (2) to a third cleaning temperature ($T_3$) in a range between 800° C. and 1000° C.;

after the process chamber (2) has reached the third cleaning temperature ($T_3$), feeding essentially only $H_2$ into the process chamber (2) in a third cleaning step (23); and after the third cleaning step (23), cooling down the process chamber (2) during a cooling process (24).

2. The method of claim 1, wherein the process gas also comprises an organometallic compound, TMGa, TMIn, or TMAl.

3. The method of claim 1, wherein the second surface is located on a graphite part (3, 5, 10, 11, 19) arranged in the reactor housing (1).

4. The method of claim 3, wherein the parasitic coating is deposited on a coating of the second surface of the graphite part (3, 5, 10, 11, 19), wherein the coating is resistant to an etching gas, a carbide coating, a TaC-coating, or an SiC-coating.

5. The method of claim 1, wherein during the heating of the process chamber (2) to the first cleaning temperature ($T_1$), one or more of an inert gas, a noble gas, $N_2$ or $H_2$ is fed into the process chamber (2).

6. The method of claim 1, wherein during the first cleaning step (21), only $Cl_2$, together with $N_2$, are fed into the process chamber (2).

7. The method of claim 1, wherein during the second cleaning step (22), only $O_2$, together with $N_2$, are fed into the process chamber (2).

8. The method of claim 1, wherein during the cooling process (24), only $H_2$ is fed into the process chamber (2).

9. The method of claim 3, wherein the graphite part is one or more of a susceptor (3) bounding the process chamber (2), a process chamber ceiling (10) bounding the process chamber (2), a gas inlet element (11), a gas outlet element (19), or a substrate holder (5) that rests on a gas cushion formed within a pocket (4) of the susceptor (3).

10. The method of claim 1, wherein at least one of:

the susceptor (3) is driven in rotation about an axis of rotation (8) at least during the deposition of the layer, or the susceptor (3) is heated by a heating device (31) during one or more of the deposition of the layer, during the heating of the process chamber (2) to the first cleaning temperature ($T_1$), during the first cleaning step (21), during the second cleaning step (22) or during the third cleaning step (23).

11. The method of claim 1, wherein during the first cleaning step (21), a total pressure in the process chamber (2) is in a range between 50 mbar and 200 mbar, wherein during the second cleaning step (22), the total pressure in the process chamber (2) is in a range between 100 mbar and 800 mbar, and wherein during the third cleaning step (23), the total pressure the process chamber (2) is in a range between 50 mbar and 200 mbar.

* * * * *